United States Patent [19]

Custers et al.

[11] 3,828,848

[45] Aug. 13, 1974

[54] NOVEL DIAMOND PARTICLE PARTICULARLY FOR USE IN HEAT SINKS

[75] Inventors: Joseph Lambert Maria Custers; Frederick Anton Raal, both of Johannesburg, South Africa

[73] Assignee: De Beers Industrial Diamond Division Limited, Johannesburg, South Africa

[22] Filed: July 21, 1972

[21] Appl. No.: 273,977

[30] Foreign Application Priority Data

July 30, 1971 South Africa........................ 71/5111
Aug. 24, 1971 South Africa........................ 71/5666
Nov. 19, 1971 South Africa........................ 71/7816

[52] U.S. Cl..................... 165/80, 165/185, 317/100, 317/234 A

[51] Int. Cl. ............................................. H01l 1/12

[58] Field of Search... 165/185, 80; 317/100, 234 A

[56] References Cited

UNITED STATES PATENTS

| | | | |
|---|---|---|---|
| 3,678,995 | 7/1972 | Collard | 165/185 |
| 3,721,289 | 3/1973 | Seal | 165/185 X |

*Primary Examiner*—Albert W. Davis, Jr.
*Attorney, Agent, or Firm*—Young & Thompson

[57] ABSTRACT

The invention provides a rounded diamond particle, which is preferably of the Type II*a*, truncated by a single planar surface or by a planar surface at each of opposed poles. These particles find particular use in heat sinks for electronic devices, the heat sink consisting of a body of a metal of good heat conductivity such as copper and a truncated diamond particle in thermal contact with the body such that a planar surface is presented away from the body and thus able to make thermal contact with an electronic device.

5 Claims, 4 Drawing Figures

NOVEL DIAMOND PARTICLE PARTICULARLY FOR USE IN HEAT SINKS

Figure 1:
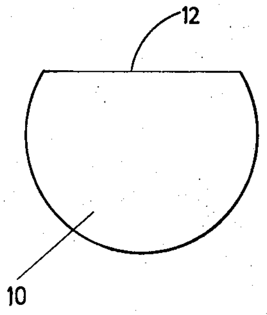

This invention relates to a novel diamond particle, particularly for use in heat sinks.

According to one aspect of the invention, there is provided a rounded diamond particle truncated by a planar surface. Preferably, the particle is truncated by a single planar surface or by a planar surface at each of opposed poles; in the latter case the planar surfaces are preferably parallel.

The diamond particles may be rounded in the conventional manner in a fluid energy mill and the particles are then preferably truncated by grinding and polishing the planar surface or surfaces to a desired latitude using a polishing scaife.

The diamond particles mentioned above find particular application in heat sinks for electronic devices. Small electronic devices are usually mounted on a much larger block made of a metal of good heat conductivity such as copper which acts as a "heat sink" for conducting heat away from the device as quickly as possible. Although such heat sinks have proved successful for a number of applications, for many small high-power devices such as junction lasers, Gunn diodes or Impatt diodes, copper heat sinks impose severe power limitations in that heat generated during use of the device is not transferred away from the device quickly enough.

It has been proposed to mount the electronic devices on cubed diamonds which are then placed in thermal contact with the copper body. However, cubing diamond particles is a laborious and costly procedure and, furthermore, only relatively large and expensive diamond particles may be utilised in this manner.

It has now been found that the truncated, rounded diamond particles mentioned above may be utilised in heat sinks. Thus, according to another aspect of the present invention a heat sink comprises a body of metal of good heat conductivity and a rounded diamond particle truncated by a planar surface and in thermal contact with the body such that the planar surface is adapted to make thermal contact with an electronic device. The metal is preferably copper.

In one form of the heat sink, the diamond particle has a single planar surface, the diamond particle being located in a recess in a surface of the body such that the planar surface is presented away from the body. With this arrangement, extremely good thermal contact is made between the diamond particle and the body.

In another form of the heat sink, the diamond particle is truncated by a planar surface at each of opposed poles, the one surface being in thermal contact with a surface of the body and the other surface being presented away from the body. The surfaces are preferably parallel.

Natural or synthetic diamonds may be used in the heat sinks, but it is preferred that diamonds of high thermal conductivity such as diamonds of the Type II*a* be used. Diamonds of this type are mined, for example, at the Premier Mine near Pretoria in South Africa and are characterised, as is known in the art, by their optical absorption properties in the ultra-violet and infrared regions of the spectrum. After rounding, particles of the Type II*a* are generally of the order of 0.25 to 2.5 mm in size.

The diamond particle may, for example, be bonded to the body by means of a thin continuous, e.g., about 3 percent by weight of the diamond, epitaxial coat of a metal of good heat conductivity, e.g., a transition metal.

Figure 2:
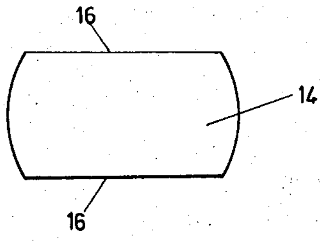
Figure 3:
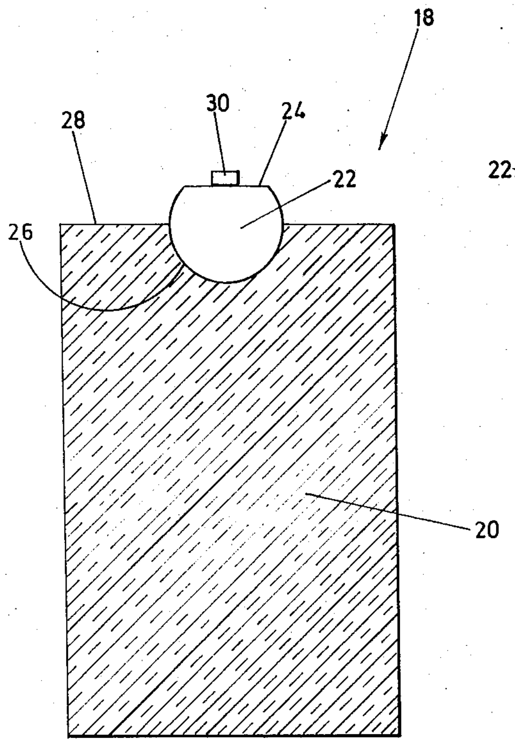
Figure 4:
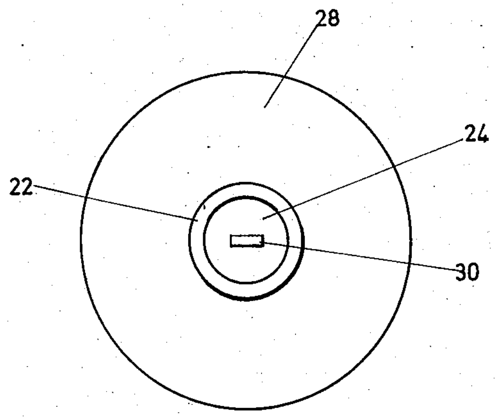

The accompanying drawing illustrates embodiments of the invention. FIGS. 1 and 2 illustrate embodiments of truncated, rounded diamonds of the invention and FIGS. 3 and 4 are, respectively, schematic sectional side and plan views of an embodiment of the heat sink of the invention.

Referring to the drawings, FIG. 1 illustrates a rounded diamond particle 10 truncated by a single planar surface 12 and FIG. 2 illustrates a rounded diamond particle 14 truncated by parallel planar surfaces 16 at each of opposed poles.

The particles are produced by first rounding them in the conventional manner in a fluid energy mill to shape as close to spherical as possible. The surface or surfaces are then formed on the particles by grinding and polishing in the manner described below.

First, a compact containing a mono-layer of the rounded diamond particles in a bronze matrix is made in the conventional manner. This compact is then mounted in a suitable holder and a polishing scaife caused to contact and traverse the mono-layer of diamond particles and in so doing grind, and simultaneously polish, a planar surface on the particles. The action of the polishing scaife is continued until a planar surface of the desired latitude is formed on the particles. The bronze matrix material is then removed from the diamonds in an acid solution and the particles recovered.

In order to obtain rounded particles truncated by planar surfaces at each of opposed poles, as illustrated by FIG. 2, particles having a single planar surface ground and polished on them, as described above, are retained in a compact with their planar surfaces facing into the compact and their rounded ends facing outwards so as to be able to make contact with the polishing scaife. The action of the polishing scaife is then repeated to produce the other planar surface and the particles removed from the matrix material in an acid solution as described above.

If the particles are to be used in heat sinks, their thermal conductivity properties may be improved by heating them with potassium nitrate at a temperature of about 500° to 800°C for about 2 hours. This has the effect of smoothing out any surface imperfections.

For heat sink applications, it is preferable to use diamonds of the Type II*a* which are generally of the order of 0.25 to 2.5 mm in size and have excellent thermal conductivity properties.

FIGS. 3 and 4 illustrate an embodiment of a heat sink of the invention for an Impatt diode. The heat sink, generally indicated by 18, consists of a cylindrical body 20 of copper and a rounded diamond particle 22 truncated by a single planar surface 24. The particle 22 is located in a recess 26 in the upper surface 28 of the copper body. The diamond particle may be so located in the copper body either by hot compressing the particle into the body or by accurately drilling or burring the recess and then inserting the particle therein. Excellent thermal contact between the diamond particle and the copper body is achieved with this arrangement.

An Impatt diode 30 is mounted on the planar surface 24 of the diamond particle. Heat generated during use of the diode is rapidly conducted by the diamond, by virtue of its excellent thermal conductivity properties, away from the diode and into the copper body.

We claim:

1. A heat sink comprising a body of a metal of good heat conductivity, and a spheroidal diamond particle truncated by a single planar surface and in thermal contact with the body such that the planar surface is adapted to make thermal contact with an electronic device.

2. A heat sink according to claim 1 wherein the diamond is of the Type II*a*.

3. A heat sink according to claim 1 wherein the surface is polished.

4. A heat sink comprising a body of a metal of good heat conductivity and a spheroidal diamond particle of the Type II*a* truncated by a single planar, polished surface, the particle being located in a recess in the surface of the body such that the planar surface is presented away from the body.

5. A heat sink according to claim 4 wherein the metal of the body is copper.

* * * * *